(12) United States Patent
Hou et al.

(10) Patent No.: US 6,833,711 B1
(45) Date of Patent: Dec. 21, 2004

(54) PROTECTIVE RELAY FOR POWERS SYSTEMS HAVING DEPENDABLE OUT-OF-STEP BLOCKING CAPABILITY

(75) Inventors: Daqing Hou, Boise, ID (US); Joseph E. Mooney, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 10/632,382

(22) Filed: Aug. 1, 2003

(51) Int. Cl.⁷ .................... G01R 31/08; H02H 3/26
(52) U.S. Cl. .................. 324/521; 324/508; 361/76; 361/79; 361/80; 361/81
(58) Field of Search ................. 324/508, 521, 324/509, 512, 522, 524, 525, 535; 361/76, 79, 80, 81

(56) References Cited

U.S. PATENT DOCUMENTS

| | | | | |
|---|---|---|---|---|
| 4,825,323 A | * | 4/1989 | Wilkinson | 361/65 |
| 5,515,227 A | * | 5/1996 | Roberts et al. | 361/67 |
| 5,731,943 A | * | 3/1998 | Roberts et al. | 361/80 |
| 5,790,418 A | * | 8/1998 | Roberts et al. | 365/121 |
| 5,808,845 A | * | 9/1998 | Roberts | 361/79 |
| 5,883,578 A | * | 3/1999 | Roberts et al. | 340/661 |
| 6,369,996 B1 | * | 4/2002 | Bo | 361/80 |
| 6,518,767 B1 | * | 2/2003 | Roberts et al. | 324/521 |

* cited by examiner

Primary Examiner—Vincent Q. Nguyen
(74) Attorney, Agent, or Firm—Cook, Alex, McFarron, Manzo, Cummings & Mehler, Ltd.

(57) ABSTRACT

The apparatus detects an out-of-step condition following the clearing of an external multi-phase fault in a protective relay. The apparatus includes a circuit which detects the presence of an external multi-phase fault on the power line and a timing circuit for readying an out-of-step logic detection circuit in the protective relay if the external fault remains for a pre-selected period of time. An out-of-step condition is declared and a signal blocking operation of selected distance elements in the protective relay is produced if the positive sequence impedance on the line remains inside an outer protection zone boundary in the impedance plane for a selected period of time, wherein the out-of-step blocking signal continues as long as the positive sequence impedance remains inside the second boundary.

7 Claims, 2 Drawing Sheets

PROTECTIVE RELAY FOR POWERS SYSTEMS HAVING DEPENDABLE OUT-OF-STEP BLOCKING CAPABILITY

DESCRIPTION

TECHNICAL FIELD

This invention relates generally to out-of-step (power swing) conditions on a power line, and more specifically concerns the detection of an out-of-step condition following clearance of an external fault on the line.

BACKGROUND OF THE INVENTION

In many power systems, particularly those in less developed countries, a condition known as power swing can occur, caused by various system conditions. A power swing can result in severe system disturbances, and is generally known in the art as an out-of-step condition. Basically, for a typical power system, during normal operation, the output of electric power from an electric power generator will produce an electric torque which balances the mechanical torque applied to the rotor shaft of the generator. Ideally, the electric power generator rotor runs at a constant speed, because of the balance of electric and mechanical torques. When a fault on the power system occurs, reducing the amount of power transmission from the generator, the electric torque, which normally balances the mechanical torque, will also decrease. If the mechanical power is not reduced during the time of the fault, the generator rotor will accelerate.

Referring now to FIG. 1, after a fault occurs, with the power output being reduced to $P_F$ from $P_0$, the generator rotor swill start to accelerate, and the angle $\delta$ between the two source generators on the line (power P is transferred between the two generators in operation of the power system) will start to increase. At the time that the fault is cleared, when the angle difference reaches $\delta_c$, there is a decelerating torque acting on the rotor because the electric power $P_C$ at the angle $\delta_C$ is larger than the mechanical power input $P_0$. However, because of the inertia of the rotor system of the motor, the angle $\delta$ will not start to go back to $\delta_0$ immediately, but rather continue to increase to $\delta_F$, when the energy lost during deceleration in area 10 of the power angle curve of FIG. 1 is equal to the energy gained during the acceleration in area 12. If $\delta_P$ is smaller than $\delta_L$, then the system is transiently stable.

With sufficient damping, the angle difference $\delta$ of the two sources eventually goes back to the original balance point of $\delta_0$. However, in the situation where area 10 is smaller than the area 12 at the time that the angle reaches $\delta_L$, then a further increase in the angle will result in an electric power output that is smaller than a mechanical power output, such that the generator rotor will accelerate again and $\delta$ will increase beyond the point of typical operational recovery, resulting in a transiently unstable situation, which is shown in the curve of FIG. 2. When such an unstable situation of the power system occurs, one equivalent generator rotates at a speed that is different than the other equivalent generator, which is a classic out-of-step (OOS) condition.

An out-of-step power system condition, besides providing inherent stability problems for the system, also may be evaluated by certain distance and phase overcurrent elements in the protective relay as a fault as opposed to an out-of-step condition. The protective relay will then operate to trip circuit breakers associated with the relay in response to the out-of-step condition, adding to the instability of the system. Such a response of the relay is thus undesirable.

Traditionally, such as described in U.S. Pat. No. 5,731,943, the rate of change of the positive sequence impedance (Z1) is monitored to detect an out-of-step condition; the operation of the distance protection elements are blocked if the impedance rate of change indicates an out-of-step condition rather than a fault. The positive sequence impedance measurement is used because the change of that impedance into a protection region defined by the protection elements of the protective relay is a slow process during an out-of-step condition, while the impedance moves rapidly from a load region into a protection region in the impedance plane when an actual fault occurs.

FIGS. 3A and 3B show illustrative double binder impedance characteristics in the impedance plane used to detect an out-of-step condition and provide a blocking signal in the distance elements. In these examples, (FIG. 3A is exemplary), the outer protection boundary impedance element $\delta$ is located inside the load region 22. While an inner protection boundary impedance element is placed outside of the over-reaching zone 2 boundary.

Typically, in order to prevent distant elements in the protective relay from operating in response to an out-of-step condition, it is conventional to block the instantaneous zone 1 distance element and the forward direction overreaching zone 2 element used in a communication/assisted tripping scheme. The inner protection zone boundary impedance element must thus be located outside of the overreaching zone 2 region. Under certain conditions at the time of fault clearance, the positive sequence Z1 impedance measured by a distance relay may already be in a protection region. If after fault clearance occurs, the impedance does not stay between the inner and outer impedance measurement elements in the impedance plane, the conventional out-of-step logic will fail to operate and will not block the distance element of operation. This will aggravate the disturbance of a power system in an out-of-step condition.

Hence, while traditional double blinder out-of-step blocking (OSB) arrangements operate correctly under most circumstances to block the operation of distance elements during an out-of-step condition, an external multi-phase/three-phase fault which is slowly cleared may result in a failure to pick up the out-of-step blocking condition because the Z1 impedance is already within the inner impedance region of out-of-step detection logic and the impedance may not stay between the inner and outer impedance measurement elements. Hence, there is a need to be able to detect an out-of-step condition for the system condition following clearance of external faults.

SUMMARY OF THE INVENTION

Accordingly the present invention is an apparatus for use in a protective relay for detecting an out-of-step condition following clearing of an external multi-phase fault, on a power line, comprising: a circuit for detecting the presence of a multi-phase fault on the power line; a timing circuit for readying, i.e. "arming", an out-of-step logic circuit if the multi-phase external fault remains for a preselected period of time; means for determining the positive sequence impedance on the power line; and a circuit for declaring an out-of-step condition and for blocking selected distance elements of the protective relay if the positive sequence impedance remains inside a selected impedance plane boundary of protection for a qualified period of time following clearing of the multi-phase external fault.

BEST MODE FOR CARRYING OUT THE INVENTION

Generally, in the present invention, involving a particular out-of-step power system condition, an external multi-phase power fault is first detected. If the eternal fault remains for a selected amount of time, for example two power cycles, then a out-of-step (OOS) detection logic circuit is "armed", i.e. the circuit is readied for operation. When the external fault is cleared, if the measured positive sequence impedance remains inside an outer protection region defined by an outer impedance measurement element for more than a specified time, for instance 0.2 power cycles, then an out-of-step blocking (OSB) condition is declared. The OSB condition will remain as long as the Z1 impedance remains inside the outer boundary impedance measuring element. As indicated above, only multi-phase faults are included because existing OSB logic systems can adequately handle single phase to ground faults. Further, loss of system synchronization following clearance of a single phase to ground fault typically is not a significant concern relative to power system stability.

Following the initial declaration of an OSB condition by the circuit of present invention, if the Z1 impedance stays inside the outer impedance element of the OOS detection logic for more than a predetermined period of time, i.e. for instance one second, or the rate of change of the impedance is less than a threshold value for a specific time, e.g. two power cycles, then the OSB condition is declared again, i.e. reset, so that blocking continues.

Figure 1:
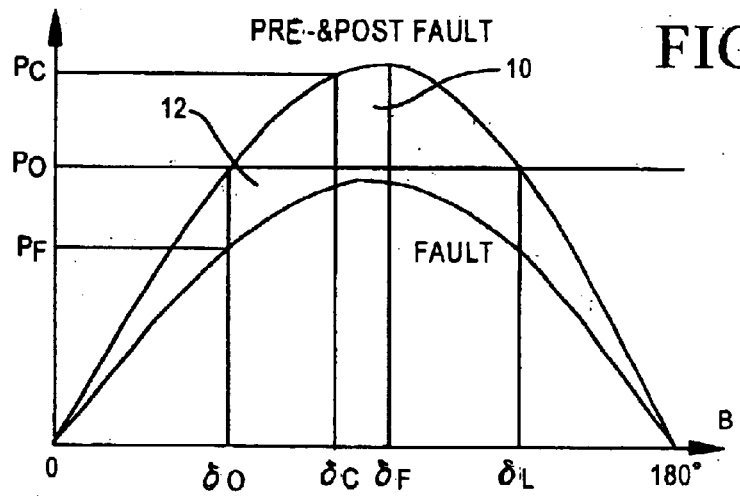
FIG. 1 shows a power angle curve for a transiently stable condition.
Figure 2:
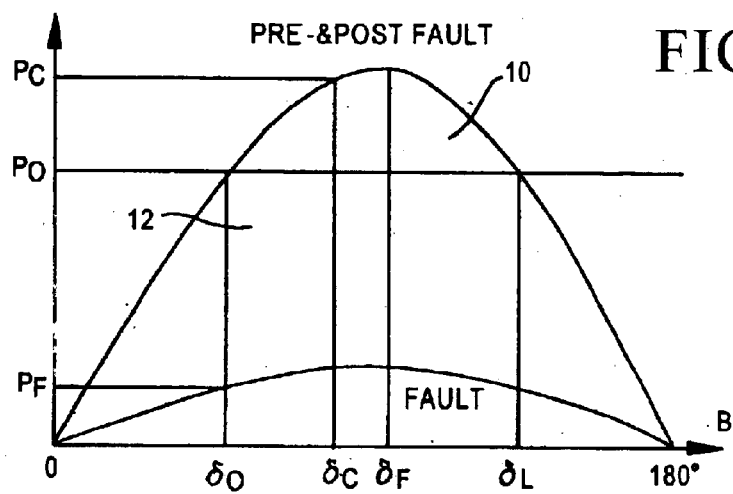
FIG. 2 shows a similar curve for a transiently unstable power system.
Figure 3A:
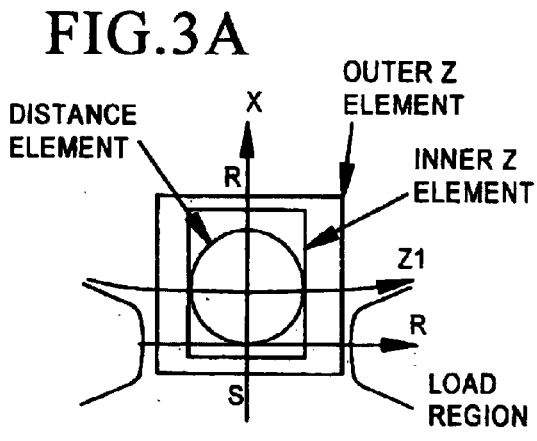
FIGS. 3A and 3B show examples of double blinder out-of-step blocking characteristics.
Figure 3B:
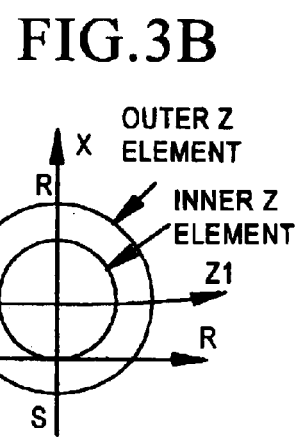
Figure 4:
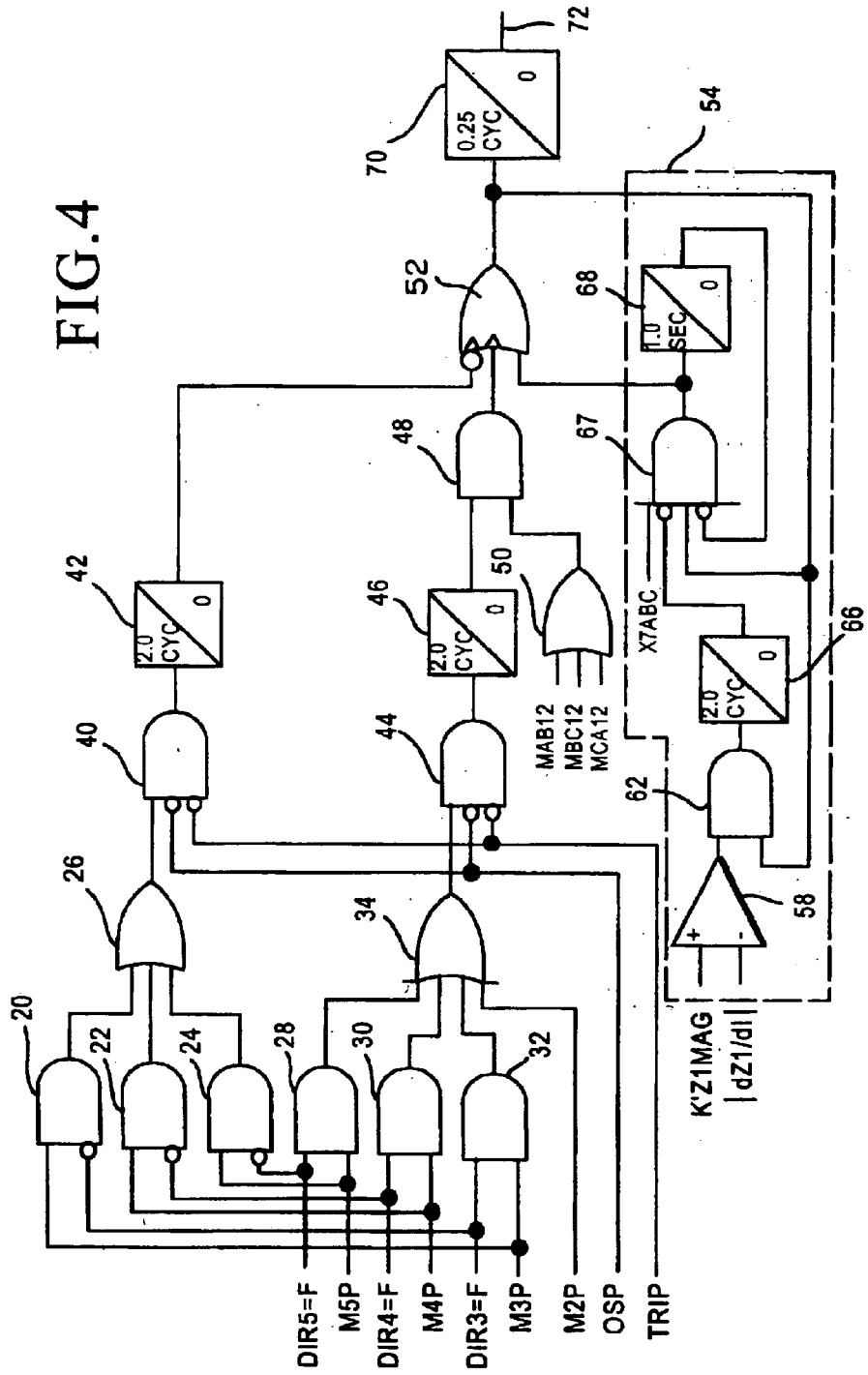
FIG. 4 shows a block diagram of the circuit of the present invention for detecting an out-of-step condition during a particular power system condition.

FIG. 4 shows the logic diagram of the circuit of the present invention. Referring now to FIG. 4, a protective relay setting for the direction of zone 3 distance elements is labeled DIR3. If DIR3 is set to a "F" setting, e.g. a logic 1, then the zone 3 distance elements detect faults that are in the forward direction relative to the source; if the DIR3 setting is "R", e.g. a logic "0", then the zone 3 distance elements detect faults that are in the reverse direction from the source. There is also zone 3 phase distant element M3P setting; the value of the M3P setting is "1" if any multi-phased faults have been detected by the protective relay within the zone 3 protection region while it is a zero. Likewise, the settings for DIR4 and M4P are a direction setting and a phase distance element setting for zone 4. Similarly DIR5 and M5P are the direction and phase distance element settings for Zone 5 protection.

M2P is the zone 2 phase distance element for the forward direction, while MAB12, MBC12 and MCA12 are Zone 1 phase distance elements with a fixed security pickup count. All of the above are conventional settings associated with a protective relay.

Further with respect to FIG. 4, the "OSB" input setting is the output of conventional concentric polygon OSB detection logic. A "1" or "high" signal on this line indicates that an OOS or power swing condition has been detected by the conventional OOS circuit in the protective relay. A "1" or "high" signal on the "trip" input indicates that the relay has closed its trip output contact and energized a circuit breaker trip coil. The X7ABC represents the outer impedance measuring element of the OOS detection logic. X7ABC is "1" if the positive sequence impedance inside the outer impedance polygon of the OOS detection logic.

In operation of the circuit, a two input AND gate 20 is responsive to the zone 3 phase distance element M3P and a zone 3 protection DIR3 setting applied to a "not" input, i.e. a "reverse" direction protection indication. Hence, the output of AND gate 20 is high if a multi-phase fault has been detected within zone 3 by the zone 3 distance element, operating in the reverse direction. Similarly, the output of AND gate 22 is high if a multi-phase fault has been detected by the relay by the zone 4 phase distance elements operating in the reverse direction. Still further, the output of AND gate 24 is high if the zone 5 distance elements operating in the reverse direction detect a multi-phase fault. The output of AND gates 20, 22 and 24 are applied to OR gate 26, the output of which is high if any of the outputs of AND gates 20, 22 and 24 are high, i.e. if a multi-phase fault has been detected within zones 3, 4 or 5. AND gates 28, 30 and 32 provide a similar function for zone 3, zone 4 and zone 5 protection for distance elements operating in the forward direction. The outputs of AND gates 28, 30 and 32 are applied to OR gate 34, the output of which is high when a multi-phase fault is recognized in the forward direction in zone 3, 4 or 5.

The output of OR gate 26 is applied to one input of a 3 input AND gate 40. The other two inputs to AND gate 40 are signals from existing protective relay elements, discussed above, namely the trip and OSB signals, both of which are applied to "not" inputs of AND gate 40. A high output from AND gate 40 indicates an existing power system condition of a reverse multi-phase fault, without an OSB condition having been declared and further with the relay not having produced a trip output. The output of AND gate 40 is applied to a time delay pickup timer 42 which has a predetermined pickup time, for instance 2 power cycles, with an instantaneous dropout time. The pickup time may be varied.

The output of OR gate 34 is applied to a 3 input AND gate 44. The other two inputs of AND gate 44 are also the existing relay signals trip and OSB, both applied to "not" inputs of the AND gate. A high output from AND gate 44 indicates a power system condition of a multi-phase fault in the forward direction from the source, without an OSB condition having been declared and with the relay not having issued a trip output.

The output of AND gate 40 is applied to a time delay pickup timer 46, which has a predetermined pickup time, e.g. two power cycles, which may be varied, and an instantaneous dropout time. The output of timer 46 is applied to one input of AND gate 48; the other input to AND gate 48 is from the output of an OR gate 50. The three inputs to OR gate 50 are the outputs of the three zone 1 distance elements referred to above, namely MAB12, MBC12 and MCA12. These zone 1 elements differ somewhat from the normal zone 1 phase distance elements in that they have a fixed two count security delay before they are picked up. The output of AND gate 48 indicates a condition of a zone 1 multi-phase fault, which has been detected more than two or more power cycles, after a forward looking outreach zone detected a multi-phase fault.

The rising edge of a high output from AND gate 40 is applied to one input of a three input OR gate 52. When the output of AND gate 48 goes from 0 to 1, the input at OR gate 50 is 1 for one processing interval of the relay. Otherwise, this particular input of OR gate 52 is 0. Another input to OR gate 52 is the falling edge of timer 42. This input is 1 for one particular processing interval only at the time when the output of timer 42 goes from 1 to 0. The last input to OR gate 52 comes from a "seal-in" logic circuit 54, discussed below in detail.

The seal-in circuit 54, which also functions as unlatch logic for OR gate 52, includes a comparator 58, AND gates 62 and 64 and timers 66 and 68. Applied to the positive input of comparator 58 is a kZ1MAG setting which is the secondary ohm value of the power line being protected by the protective relay, k is the selected constant. The other input to the comparator, i.e. |dz1/dt| is the absolute value of the rate of change of the positive sequence impedance Z1. With a maximum OOS time of two seconds and a total system impedance of 1.5 times the line impedance, the minimum value of |dz1/dt |is 3π/8 times Z1MAG, which happens when δ equals 180. A high output from comparator 58 indicates that the positive sequence impedance (Z1) rate of change is smaller than the minimum value of the rate of change that comes from a true OOS (out-of-step condition).

The output of comparator 58 is applied to an AND gate 62. The other input from AND gate 62 comes from the output of OR gate 52. The output of AND gate 62 is applied to timer 66 which has a definite pickup time, i.e. two power cycles, although other times may be used, and an instantaneous dropout time, qualifies the output of AND gate 62. The output of timer 66 indicates a condition that during the time that the output of OR gate 52 is a logic 1, the impedance rate of change of Z1 has decreased below a minimum value for at least two years.

The output of timer 66 is applied to a "not" input of a four input AND gate 67. The other inputs to AND gate 64 are the X7ABC signal discussed above (the outer impedance measurement element of the OOS circuit), the output of OR gate 52 and a feedback output from a timer 68, to which the output of AND gate 67 is applied. Timer 68 in the embodiment shown is a time delayed pickup timer with a pickup time of one second and instantaneous dropout time.

In operation of the circuit of FIG. 4, when the output of OR gate 52 is high (asserted), and the positive sequence impedance Z1 stays inside the outer impedance region defined by the OOS detection logic, then the output of AND gate 67 will be high without outputs from timers 66 and 68. A high output from AND gate 67 is applied to OR gate 52 which will maintain its output high. The output of AND gate 67 is reset when its output asserts for more than one second or if the impedance rate of change of Z1 is below a minimum threshold for more than two power cycles.

The output of OR gate 52 is applied to an output timer 70 which produces an output on line 72. The timer 70 has a fast pickup of 0.25 cycles and an instantaneous dropout. A high output on line 72 indicates that an OSB, (out-of-step blocking) condition should be initiated. In the preferred embodiment, the output on line 72 is applied to an OR gate, along with the output of a conventional OSB detection circuit, such as a conventional double blinder arrangement to extend the protection and increase the dependability of OOS detection in the particular circumstance following the clearing of an external multi-phase fault.

Accordingly, a circuit arrangement has been disclosed which provides an out-of-step blocking capability to block the operation of distance elements in a protective relay in the situation following the clearing of a multi-phase fault.

Although a preferred embodiment of the invention has been disclosed for purposes of illustration, it should be understood that various changes, modifications and substitutions may be incorporated in the invention without departing from the spirit of the invention which is defined by the claims which follow.

What is claimed is:

1. An apparatus for use in a protective relay for detecting an out-of-step condition following clearing of an external multi-phase fault, on a power line, comprising:
   a circuit for detecting the presence of a multi-phase fault on the power line;
   a timing circuit for readying an out-of-step logic circuit if the multi-phase external fault remains for a preselected period of time;
   means for determining the positive sequence impedance on the power line; and
   a circuit for declaring an out-of-step condition and for blocking selected distance elements of the protective relay if the positive sequence impedance remains inside a selected impedance plane boundary of protection for a qualified period of time following clearing of the multi-phase external fault.

2. The apparatus of claim 1, wherein the blocking of selected distance elements continues as long as the positive sequence impedance is within the selected boundary of protection.

3. The apparatus of claim 1, wherein the preselected period of time is approximately two power system cycles.

4. The apparatus of claim 1, when the qualified period of time is approximately 0.25 power cycles.

5. The apparatus of claim 1, wherein there are inner and outer boundary zones of protection defined by inner and outer impedance elements and wherein the selected boundary is the outer boundary.

6. The apparatus of claim 1, wherein if the value of positive sequence impedance remains inside the selected boundary zone of protection for more than a specific period of time, or if the rate of change of the positive sequence impedance is less than a threshold value for a certain period of time then the out-of-step blocking condition is redeclared.

7. The apparatus of claim 1, wherein the apparatus is responsive to a multi-phase fault occurring in any one of a plurality of zones of protection of the protective relay.

* * * * *